(12) United States Patent
Bohizic et al.

(10) Patent No.: US 7,356,436 B2
(45) Date of Patent: Apr. 8, 2008

(54) METHOD, SYSTEM, AND STORAGE MEDIUM FOR ESTIMATING AND IMPROVING TEST CASE GENERATION

(75) Inventors: Theodore J. Bohizic, Hyde Park, NY (US); Ali Y. Duale, Poughkeepsie, NY (US); Dennis W. Wittig, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 341 days.

(21) Appl. No.: 11/048,965

(22) Filed: Feb. 2, 2005

(65) Prior Publication Data

US 2006/0174174 A1 Aug. 3, 2006

(51) Int. Cl.
*G06F 3/01* (2006.01)
(52) U.S. Cl. ............... 702/119; 702/120; 702/182; 702/183
(58) Field of Classification Search ............... 702/179, 702/181, 183, 186, 188, 190, 119, 120, 182, 702/117, 123; 709/222; 714/31; 716/5; 717/106
See application file for complete search history.

(56) References Cited

U.S. PATENT DOCUMENTS

| | | | | |
|---|---|---|---|---|
| 4,433,413 A | | 2/1984 | Fasang | 371/25 |
| 4,639,916 A | | 1/1987 | Boutterin et al. | 371/16 |
| 5,021,997 A | * | 6/1991 | Archie et al. | 714/31 |
| 5,109,484 A | * | 4/1992 | Hughes et al. | 709/222 |
| 5,159,600 A | | 10/1992 | Chintapalli et al. | 371/27 |
| 5,202,889 A | | 4/1993 | Aharon et al. | 371/27 |
| 5,572,666 A | | 11/1996 | Whitman | 395/183.08 |
| 5,951,703 A | | 9/1999 | Sprouse et al. | 714/730 |
| 6,182,245 B1 | | 1/2001 | Akin et al. | 714/38 |
| 6,401,226 B1 | | 6/2002 | Maeno | 714/728 |
| 6,421,822 B1 | | 7/2002 | Pavela | 717/125 |
| 6,606,721 B1 | | 8/2003 | Gowin, Jr. et al. | 714/728 |
| 6,615,120 B1 | | 9/2003 | Rother | 701/33 |
| 6,782,518 B2 | * | 8/2004 | Decker | 716/5 |
| 7,140,003 B2 | * | 11/2006 | Decker | 717/106 |

OTHER PUBLICATIONS

Yossi Lichtenstein, et al.; Model Based Test Generation for Processor Verification; Pproc.7th Innovative Applications of Artificial Intelligence Conference, AAA1 pres, 1994, pp. 83-94.
Laurent Fournier, et al.; Functional Verification Methodology for Microprocessors Using the Genesys Test-Program Generator; Dec. 17, 1998; Proc; Proc. Automation and Test in Europe, IEEE CS press, 1999 pp. 434-441.
Satz, PJ, "Random Instruction Sequence Test Program",TDB n9b, Feb. 1990, pp. 208-210.
Glenn, SC "Power PC 601/604 Multiprocessor Random Verification Methodology," TDB v37 n10, Oct. 1994, pp. 557-562.

* cited by examiner

*Primary Examiner*—Eliseo Ramos-Feliciano
*Assistant Examiner*—Felix Suarez
(74) *Attorney, Agent, or Firm*—Cantor Colburn LLP; Arthur Ortega

(57) ABSTRACT

A technique for estimating and improving the test coverage for large machines, while accumulating minimum information of past test cases (i.e., minimum feedback) is provided. The technique is scalable in the sense that the number of machine instructions needed to measure the test coverage can range from a few instructions to all the instructions. The technique is easily integrated into existing test generation systems and is applicable to both uni- and multi-processing systems.

14 Claims, 3 Drawing Sheets

METHOD, SYSTEM, AND STORAGE MEDIUM FOR ESTIMATING AND IMPROVING TEST CASE GENERATION

BACKGROUND OF THE INVENTION

1. Field of the Invention

The present invention relates generally to software and hardware test, logic array and hybrid testers, test architecture, test coverage and, in particular, to test generation tools, test coverage and system level testing.

2. Description of Related Art

One of the challenging issues in random testing is measuring the test coverage of a given test generation tool. In conventional pseudo-random test generation methods, test cases are built by using streams of instructions and/or input/output commands selected from a group containing instructions and/or commands. Depending on the system under test (SUT), the number of valid instructions can be on the order of hundreds or even thousands. The selection criteria for these instructions has a direct impact on the achieved test coverage. The complexity of measuring the test coverage increases with the complexity of the SUT. Introducing a new test coverage measurement mechanism into an existing test generation tool can be time consuming and difficult.

Estimating and improving test case generation is important for gaining confidence in system tests and to improve test quality. Measuring test coverage of a given test generation tool can be costly. Tracking each instruction and using feedback (between the test case build and result prediction processes) requires extensive analysis and consumes substantial test time.

There is a need for a test coverage measuring and enhancing method that can be easily incorporated into existing pseudo-random test generation methods. Also, there is a need for a method that includes biasing schemes used by pseudo-random test case generation methods.

BRIEF SUMMARY OF THE INVENTION

The present invention is directed to methods, systems, and storage mediums for estimating and improving test case generation, which satisfy these needs and others.

A first aspect is a method for estimating and improving test case generation. A plurality of instructions to be tested classified into groups so that the members of each group are instructions that have similar architectural behavior. At least one group agent is selected to represent each group. A checklist is generated for the group. The checklist includes test conditions. Test cases are generated for the group using the checklist.

A second aspect is a system for estimating and improving test case generation, including a storage medium, a bias scheme, and a test case build component. The storage medium stores checklist information. The checklist information includes test conditions for one group of a number of groups of instructions. This group is represented by one or more group agents, which are one or more of the instructions in the group. The bias scheme component generates test data for the group agent. The test data is biased towards improving test coverage for the group. The test case build component generates test cases using the checklist information and the biased test data.

A third aspect is a storage medium storing instructions for performing a method for estimating and improving test case generation. A set of instructions is classified into groups according to their architectural behavior. A dominating pool is determined. The dominating pool is a group with low test coverage compared to the other groups. A condition is selected from a checklist associated with the dominating pool. An instruction in the dominating pool is randomly selected. Test cases are generated for the selected instruction according to the condition.

BRIEF DESCRIPTION OF THE DRAWINGS

These and other features, aspects, and advantages of the present invention will become better understood with regard to the following description, appended claims, and accompanying drawings, where:

DETAILED DESCRIPTION OF THE INVENTION

Exemplary embodiments are directed to methods, systems, and storage mediums for estimating and improving test case generation.

Figure 1:
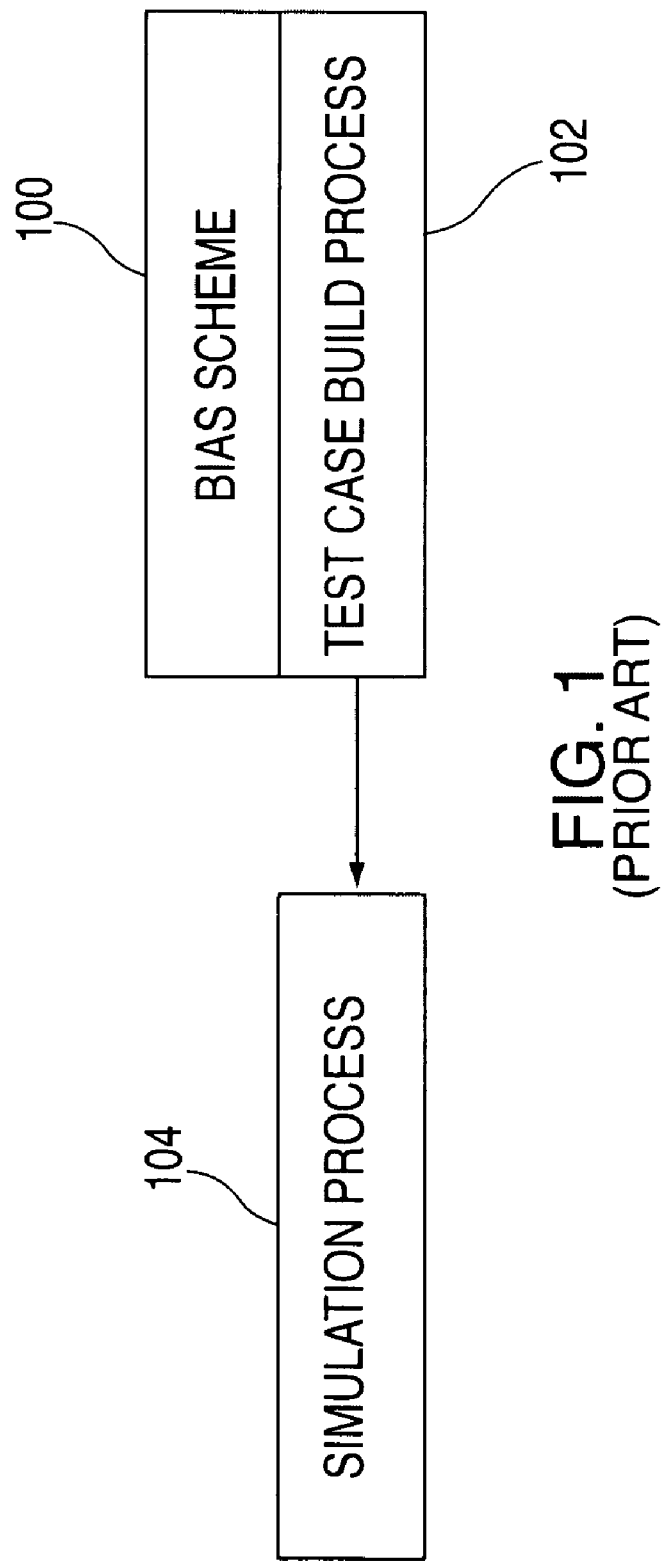
FIG. 1 is a block diagram of an exemplary embodiment of a pseudo-random test generation method without test coverage.

FIG. 1 shows an exemplary embodiment of a pseudo-random test generation method without test coverage. This exemplary embodiment includes a bias scheme 100, a test case build process 102, and a simulation process 104. A bias scheme 100 is used to select test instructions and data for test cases. A test case build process 102 generates test cases for system tests that are executed in the simulation process 104, which predicts results. The test case build process 102 does not benefit from the effectiveness of the previous test cases. This exemplary embodiment may be an existing system that can be modified to include test coverage and modified to estimate and improve test case generation.

Figure 2:
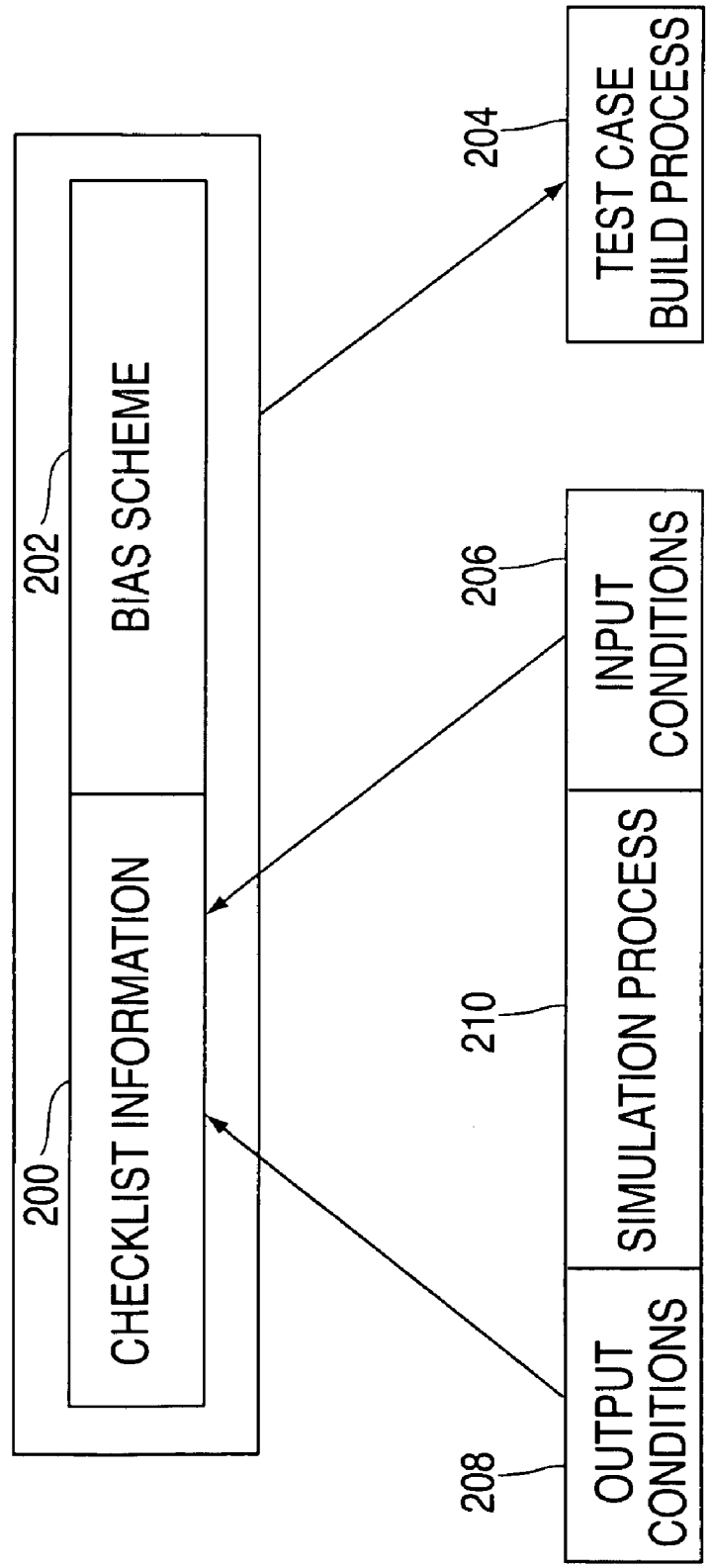
FIG. 2 is a block diagram of an exemplary embodiment of a pseudo-random test generation method with test coverage.

FIG. 2 shows an exemplary embodiment of a pseudo-random test generation method with test coverage. This exemplary embodiment also includes a bias scheme 202, a test case build process 204, and a simulation process 210, which may be the same or similar as those in FIG. 1 or may be improved. This exemplary embodiment also includes checklist information 200, input conditions 206, and output conditions 208.

The checklist information 200 for the group agents and test coverage data is updated at the beginning and at the end of the simulation process 210. In some exemplary embodiments, user input is incorporated in the checklist information 200. In some exemplary embodiments, the checklist information 200 stores test coverage data in a three-dimensional matrix.

The bias scheme 202 is useful for selecting test data biased towards a particular kind of instruction, say memory-to-memory instructions or arithmetic instructions. In an exemplary embodiment, a first instruction is selected randomly using a bias scheme to bias selection towards the desired kind of instruction. In some exemplary embodiments, the bias scheme 202 uses a history that may include prior test cases and test results and other information. In some exemplary embodiments, the bias scheme 202 selects test data to improve test coverage using checklist information 200.

The test case build process 204 accesses the checklist information 200 and determines which groups should be selected more often in a current test case. The test case build process 204 may also enhance the generation of data for the group having minimum test coverage.

The simulation process 210 receives test cases from the test case build process 204. Before simulation, if the instruction that is being simulated is a group agent, test coverage data is collected by updating the checklists belonging to this group agent. After simulation, the test results or output conditions 208 are collected to update the checklist and, therefore, the test coverage data of the group agent. In other words, if the instruction that is being simulated is not a group agent, checklists are not updated. However, the instruction's test coverage is estimated or deduced from the test coverage of the group agent(s). This saves both test time and effort.

Figure 3:
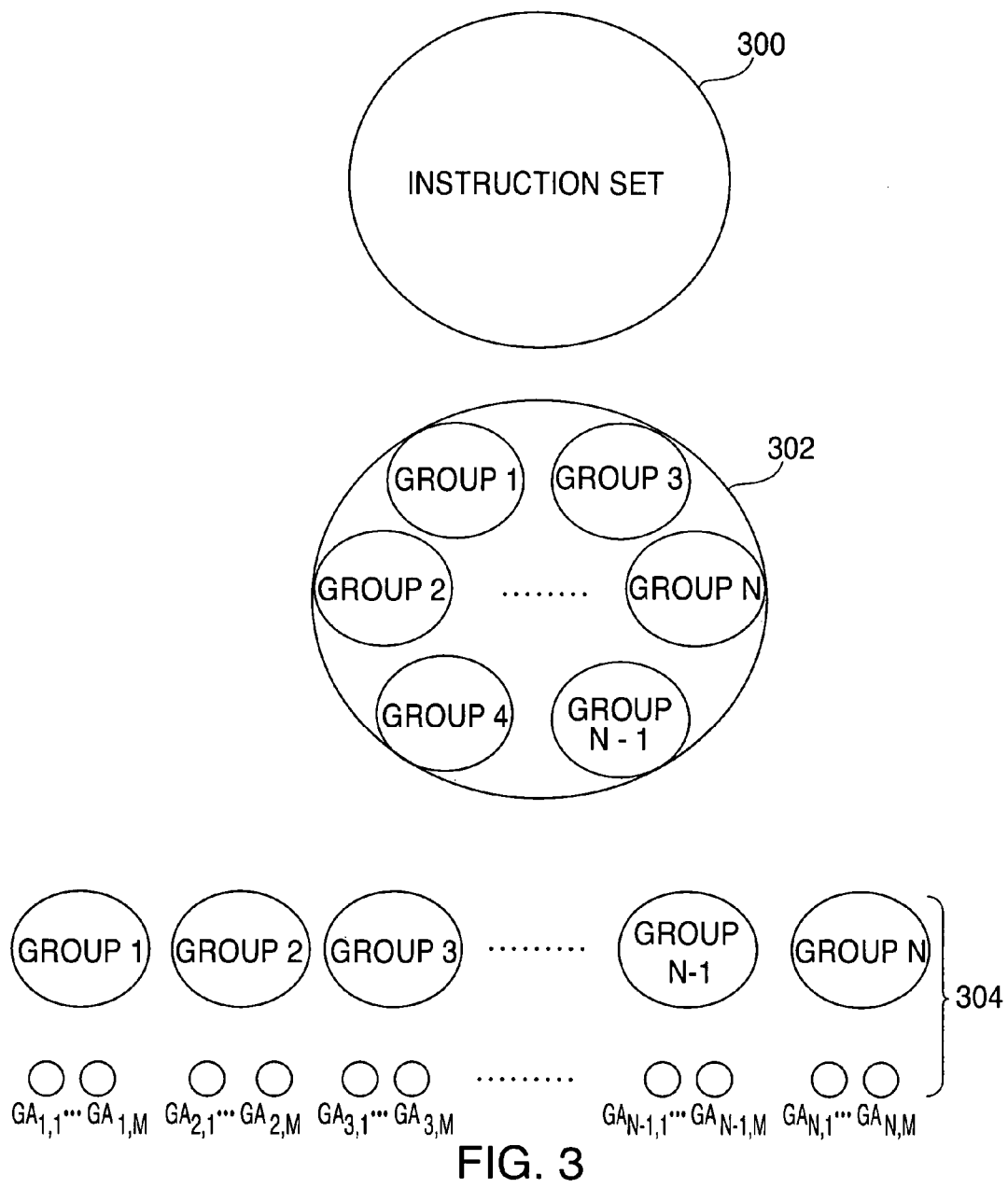
FIG. 3 is a block diagram of exemplary groupings of instructions generated by exemplary embodiments.

FIG. 3 shows exemplary groupings of instructions generated by exemplary embodiments. Instructions may be machine language instructions, or any other kind of high-level or low-level instructions for any kind of machine. An instruction gset 300, is grouped into a number of groups, {$group_1$, $group_2$, $group_3$, $group_4$ ... $group_{n-1}$, $group_n$} 302, each group having group agents {$GA_{1,1}$, ... $GA_{1,M}$, $GA_{2,1}$, ... $GA_{2,M}$ ... $GA_{N,1}$ ... $GA_{N,M}$} 304 to represent the group. Each group can be represented by one or more group agents. (Groups are also known as pools.)

In general, for any architecture, there are groups of instructions that share common architectural behavior. The reduction of the frequency of selecting instructions higher test coverage can enhance the test coverage of instructions with lower test coverage. Test coverage of particular instructions that are representative of the group can be used to estimate and improve system test coverage.

A checklist for an instruction, such as the one shown in Table 1 below, includes input and/or output conditions for test cases to test that instruction. By reducing the frequency of selecting an instruction whose checklist is entirely covered, the test coverage of other instructions is enhanced. Exemplary embodiments estimate and/or enhance test coverage.

TABLE 1

Exemplary checklist op1 = op2
|op1| = |op2| and op1 != op2 (different signs)
op1 = op2 and is infinity or NaN
op1 != op2 and either one is infinity or NaN
op1 is large and op2 is tiny
op1 = 0
op1 is close to MAX
op1 is SUBNORMAL In an exemplary embodiment, instructions are grouped into classes based on their architecturally defined properties, architectural behavior, implementations, and the like. From each group, a number of instructions, which may range from one instruction to the total number of instructions in the group, are selected as group agents (a/k/a group representatives). Furthermore, when the number of group agents is large, the group agents can be reduced. In some embodiments, group agents may be changed dynamically so that each instruction in the group is capable of being a group agent at any given time. Grouping helps alleviate the difficulties associated with analyzing system test coverage at the instruction level, especially for large systems.

In this exemplary embodiment, after an instruction is selected as a group agent, the checklist is created. This checklist includes input and output conditions that need to be tested for that instruction. The checklist may be obtained from an architectural description of the instruction. In some embodiments, the instruction is modeled as a finite state machine to facilitate the creation of the checklist. Employing group agents in this way alleviates the difficulty associated with checking and improving the test coverage of a system with a large number of instructions.

In this exemplary embodiment, a group having the least test coverage is determined. Among the checklists for that group, the criterion with the least test coverage is identified for test case selection. After the test case is executed, test coverage of individual instruction groups and overall system test coverage are provided, such as in a report.

Instructions are selected more often when they are in a group with low test coverage. The test coverage is indicated in checklists (see Table 1) for a group associated with the agent. On the other hand, instructions are selected less often when they are in a group with high test coverage. When a group agent is executed, the input/output checklist for the group agent instruction is updated. As the test coverage for the group approaches being fully satisfied, the probability of allowing instructions in the group to participate in the next stream is reduced. However, the probability of selecting such a group is never reduced to zero. In other words, none of the groups are deprived from being selected in any given test case generation pass.

In this exemplary embodiment, the checklist is updated by a result prediction process and used subsequently for test case building. The result prediction process passes the relative weights that groups are capable of carrying to the test case build process. Based on these relative weights, the test case building process selects instructions for refined test cases. If a certain group agent's checklist is not fully checked or it takes longer to complete that checklist compared to the other groups, then there is a need for improvement at the test case building process. In this exemplary embodiment, once an instruction is selected, data is generated to enhance test coverage for the group that the instruction belongs to. If a checklist for a certain group agent does not become fully checked or takes longer to become completed than checklists for other groups, then there is a need for improvement in the test case building process. In this case, relevant information is provided to the tester.

In this exemplary embodiment, instructions that are group agents are treated the same as other instructions. In other words, although group agents are used to determine the group from which to select the next instruction, each group member has an equal chance of being selected.

In some exemplary embodiments, the result prediction process is extended to multiprocessing systems testing, where interactions among different processors are often emphasized in test cases. For systems with error reproduction capability, exemplary embodiments attempt not to disturb such capability. Exemplary embodiments may be incorporated into existing test generation tools. Because exemplary embodiments are scalable, incorporation into existing test generation tools is minimized.

An exemplary embodiment creates instruction groups, creates agents for each group, creates checklist for each group, updates checklists as instructions are executed, biases selection to groups having the least test coverage, and biases input data to enhance covering checklists. In some embodiments, groups are generated, groups with minimum test coverage are selected, an area of test emphasis is determined, test coverage is updated, and test coverage output is displayed. In some embodiments, group agents functionally represent the group, agent and non-agent instructions are treated equally during test generation, checklists cover hard to test scenarios, and checklists are used in instruction selection and data biasing.

An exemplary embodiment performs the sample algorithm in Table 2. This algorithm builds test cases using group agents. This algorithm includes determining the group with minimum test coverage and determining an area for enhancement using the checklists of group agents.

TABLE 2

Sample algorithm

1. Classify instructions into groups;
2. Select group agents;
3. while (not EOS) /* end of stream not reached */
4. if ((do_specials = False) AND (enhance = on)) /*no special cases*/
5.    if (no d_p) /* no dominating pool */
6.       select c ∈ C; /* randomly select entry from checklist matrix */
7.       select p: coverage(p) = min coverage(P);
8.       d_p = p; /* set the pool to dominate for a while */
9.    if (d_p) AND (rand(j) = True) /* dominating pool */
10.       select i ∈ d_p; /* randomly select instruction from dominating pool */
11. if ((i ∈ d_p) AND (rand(j) = True)) /* instruction belongs to coverage pools */
12.    peek coverage; /* check coverage matrices */
13.    bias input;

In this exemplary embodiment, instructions are classified into groups (a/k/a pools) and group agents are selected to represent each group. During test case generation, while a particular number of instructions remain to be chosen, the following actions are performed. If there are no special test objectives and test coverage enhancement is the goal, for example, it is checked if there is dominating pool (i.e., a group of instructions that should dominate the test case due to the group's low test coverage). At the start, there is no dominating pool and all the groups are the same. As groups are selected, some groups have more or less coverage than other groups. The pool (p) that has group agents with the minimum test coverage is selected to be the dominating pool. When a dominating pool exists, a random number is generated to determine whether instructions can be randomly selected from the dominating pool. Assuming that the generated random number falls within a predefined range, the current instruction for the test case is randomly selected from the dominating pool. Test data for the operands for the current instruction is biased to improve the instruction's test coverage. By peeking the test coverage achieved by the group agent(s), the input data for the current instruction is biased towards the least covered cases. The checklists of the group agent(s) are used as a basis for the group's test coverage.

Preferably, test coverage measurement is minimized in exemplary embodiments by searching for a group having the least test coverage when selecting test case. Suppose an instruction set has thirty instructions that are classified into three groups, which are represented by three instructions (group agents), one instruction per group. For each group agent, there are ten scenarios to be tested.

Checklists of the group agents can be represented as two-dimensional arrays. However, to represent the checklist items of the multiple groups, three-dimensional arrays are needed. For example, array C[i, j, k], where i, j, and k are the group, agent, and checklist item indices respectively.

A simple way to determine the group with the least test coverage is to find the group agents with checklists having the maximum minimums. This would require more than thirty comparisons. To reduce the overhead related to the process of finding the group with the least test coverage, exemplary embodiments attempt to minimize the number of comparisons performed. If a group with the least test coverage is to be identified, two indices of j and k are selected randomly and the group i whose <j, k> element is the minimum is considered to have the least test coverage. This makes the number of comparisons just two. In the long run, each <j, k> will be used as a base for comparison. In general, with this exemplary embodiment, only n comparisons are performed each time, for a system with n groups, the group with the least test coverage is to be found.

The checklist, which is updated by the result prediction process, is used during subsequent test case building, in this exemplary embodiment. Updating the checklist does not require analysis of the paths taken during the result prediction process. Instead, the checklist is updated by examining the inputs and outputs of individual group agents. The information for an individual group that is passed by the result prediction process to the test case build process is a weight that that individual group can carry. Based upon the weights for the groups, the test case build process selects instructions for refined test cases.

In this exemplary embodiment, the instructions in groups that are marked for agents and non-agents are treated alike. In other words, although group agents are used to determine the group from which the next instruction is selected, the group members have equal chances of being selected. The group (or set of instructions whose agents have the minimum test coverage are labeled as a dominating pool when its members are selected for a certain number of consecutive times.

Once an instruction that belongs to a group that has less test coverage is selected, the exemplary embodiment attempts to generate data for the instruction that would enhance test coverage for the group. For example, suppose that an add instruction is chosen to represent a group. Based on the test coverage achieved by the add instruction, it is determined that the group represented by the add instruction has the minimum test coverage. The checklist for the add instruction indicates that a test case having operands of the same magnitude but different signs has not been generated yet. In this example, instructions from the group represented by the add instruction are selected more often than the rest of the instructions. Furthermore, test cases having operands of the same magnitude but different signs are also generated.

Suppose after a long period of testing, a checklist for a particular group agent is not fully checked or the checklist for this particular group takes longer to be completed compared to the other groups. This may be caused by weaknesses in the test case build process and can serve as an indication that the test case build process needs improvement. In this case where the checklist for a particular group agent is not fully checked, relevant information is presented to the tester.

Consider two IBM™ ESAME groups of instructions, multiply un-normalized (MU) and multiply and add un-normalized (MAU). These two groups include twelve instructions, each group having similar architected behaviors. There are six instructions in the MU group and six instructions in the MAU group. Each of the six MU instructions takes two hexadecimal floating point operands, multiplies them, and places at least a portion of the un-normalized result in floating point registers. Each of the six MAU instructions multiples two hexadecimal operands and adds the un-normalized result to the contents of the first operand. The MAU instructions place at least a portion of the result in the first operand. Some differences between the MU and the MAU instructions include: operand lengths (64 or 128 bits), operand sources (floating point registers or a combination of floating point registers and memory), and whether at least a portion of the result is placed in the first operand.

In this exemplary embodiment, the MU and MAU instructions are a group, because the architectural behavior (i.e., definitions, and implementations) of these instructions is similar. Two of the MU and MAU instructions are selected as group agents, in this exemplary embodiment. One group agent is selected from instructions with 128 bit operands. These operands come from a combination of floating point registers and memory and at least a portion of the instruction results is placed in the first operand. The other group agent is selected to be an instruction that has 64 bit operands that come from floating point registers and the whole result in placed in the first operand.

In this exemplary embodiment, a goal is to assure that these instructions are well tested while minimizing the overhead of the test coverage. Since the group agents may be dynamically changed, each of the MU and MAU instructions could be a group agent at any given time.

In this exemplary embodiment, the checklist for a group agent depends on the test cases that the test designer needs to accomplish. Suppose the checklist includes the basic features that need to be covered for the group agent. Table 3 shows an exemplary checklist for the MU and MAU agents.

TABLE 3

Exemplary checklist for MU and MAU agents.

1. Operand one is equal to operand two.
2. Operand one and operand two have the same magnitude but different signs.
3. Operand one's exponent is or is close to the maximum value, while operand two's exponent is or is close to the minimum value.
4. Both operand one's exponent and operand two's exponent are or are close to the maximum value.
5. Operand one's exponent is less than the maximum value but the sum of the exponents is greater than the maximum value.
6. Either or both operands are zero.
7. Both operands are positive and non-zero, but the result is zero.
8. Specification exceptions, if applicable.
9. Protection exceptions, if applicable.

Some exemplary embodiments are extended to multiprocessing systems testing, where interactions among different processors are emphasized. Some exemplary embodiments attempt not to disturb systems with error reproduction capability. Exemplary embodiments may be incorporated into existing test generation tools. Because exemplary embodiments are scalable, the effort of incorporation into test generation tools is lessened.

Exemplary embodiments have many advantages. Exemplary embodiments classify instructions into groups and create group agents. There is a focus on group agencies, rather than the entire instruction group. Exemplary embodiments are scalable so that the number of group agents can be increased or decreased easily. The usage of test coverage achieved by group agents in the process of building new test cases is improved for both instruction selection and data generation time. Exemplary embodiments use checklists from the group agents as test coverage estimation and enhancement. Exemplary embodiments may be used for test coverage estimating and/or enhancing a test engine. Exemplary embodiments may be easily incorporated into existing test generation tools. Exemplary embodiments maintain error reproduction capabilities.

Additional advantages include estimating test coverage of randomly generated test cases, enhancing test coverage, scalability and adaptability of test coverage, minimizing test coverage overhead, and maintaining error reproducibility, while keeping minimum information, among others.

As described above, the embodiments of the invention may be embodied in the form of computer implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, future improvements or changes to standards may be used with minor adaptations of various embodiments of the present invention. Furthermore, various components may be implemented in hardware, software, or firmware or any combination thereof. Finally, many modifications may be made to adapt a particular situation or material to the teachings of the invention without departing from the essential scope thereof. Therefore, it is intended that the invention is not to be limited to the particular embodiment disclosed as the best or only mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A method for estimating and improving test case generation, comprising:
   classifying a plurality of instructions into a plurality of groups according to architectural behavior;
   determining a dominating pool from the groups, the dominating pool being a group having relatively low test coverage in comparison to the other groups;
   selecting a condition from a checklist associated with the dominating pool;
   randomly selecting an instruction in the dominating pool; and
   generating test cases for the selected instruction according to the condition.

2. The method of claim 1, further comprising:
   biasing test data for the test cases to improve test coverage.

3. The method of claim 2, wherein the test coverage includes test input and output conditions.

4. The method of claim 1, further comprising:
   selecting at least one group agent for each group;
   wherein the selected instruction is the group agent for the dominating pool.

5. The method of claim 4, further comprising estimating test coverage for the group with test coverage for the group agent.

6. The method of claim 1, wherein test cases are generated pseudo-randomly.

7. A system for estimating and improving test case generation, comprising:
   a storage medium storing checklist information, the checklist information including test conditions for a plurality of instructions classified into a plurality of groups according to architectural behavior;
   a bias scheme component for determining a dominating pool from the groups, the dominating pool being a group having relatively low test coverage in comparison to the other groups, selecting a condition from a checklist associated with the dominating pool, and randomly selecting an instruction in the dominating pool; and
   a test case build component for generating test cases for the selected instruction according to the condition.

8. The system of claim 7, further comprising:
   a simulation component for running the test cases and for updating checklist for each of a plurality of group agents selected for each group, wherein the selected instruction is the group agent for the dominating pool.

9. The system of claim 7, further comprising:
   a checklist update component for updating test coverage information for the group based on test cases and test results.

10. The system of claim 7, further comprising:
    a second storage medium for storing test coverage and history information.

11. A computer program product, comprising:
    a computer storage medium including computer readable computer program code for estimating and improving test case generation; and
    instructions for causing a computer to implement a method, the method further comprising:
    classifying a plurality of instructions into a plurality of groups according to architectural behavior;
    determining a dominating pool from the groups, the dominating pool being a group having relatively low test coverage in comparison to the other groups;
    selecting a condition from a checklist associated with the dominating pool;
    randomly selecting an instruction in the dominating pool; and
    generating test cases for the selected instruction according to the condition.

12. The computer program product of claim 11, wherein the method further comprises:
    biasing test data for the test cases to improve test coverage.

13. The computer program product of claim 11, wherein the method further comprises:
    selecting at least one group agent for each group;
    wherein the selected instruction is the group agent for the dominating pool.

14. The computer program product of claim 13, wherein the method further comprises:
    estimating test coverage for the group with test coverage for the group agent.

* * * * *

UNITED STATES PATENT AND TRADEMARK OFFICE
CERTIFICATE OF CORRECTION

PATENT NO. : 7,356,436 B2 Page 1 of 1
APPLICATION NO. : 11/048965
DATED : April 8, 2008
INVENTOR(S) : Bohizic et al.

It is certified that error appears in the above-identified patent and that said Letters Patent is hereby corrected as shown below:

Column 9:
Lines 29 through 43 delete cancelled claim 7

Column 10:
Lines 1 through 42 delete cancelled claims 8 through 14

Signed and Sealed this

Twenty-fifth Day of August, 2009

David J. Kappos
*Director of the United States Patent and Trademark Office*